United States Patent
Sakaguchi

(10) Patent No.: US 10,777,619 B2
(45) Date of Patent: Sep. 15, 2020

(54) ORGANIC EL DEVICE

(71) Applicant: NEC LIGHTING, LTD., Tokyo (JP)

(72) Inventor: Yoshikazu Sakaguchi, Tokyo (JP)

(73) Assignee: HotaluX, Ltd., Tokyo (JP)

( * ) Notice: Subject to any disclaimer, the term of this patent is extended or adjusted under 35 U.S.C. 154(b) by 0 days.

(21) Appl. No.: 16/338,313

(22) PCT Filed: Jul. 27, 2017

(86) PCT No.: PCT/JP2017/027155
§ 371 (c)(1),
(2) Date: Mar. 29, 2019

(87) PCT Pub. No.: WO2018/087964
PCT Pub. Date: May 17, 2018

(65) Prior Publication Data
US 2020/0027934 A1    Jan. 23, 2020

(30) Foreign Application Priority Data
Nov. 11, 2016    (JP) ................... 2016-220241

(51) Int. Cl.
*H01L 27/06* (2006.01)
*H01L 27/32* (2006.01)
(Continued)

(52) U.S. Cl.
CPC ...... *H01L 27/3225* (2013.01); *H01L 27/0288* (2013.01); *H01L 27/06* (2013.01);
(Continued)

(58) Field of Classification Search
CPC ......... H01L 28/20; H01L 28/40; H01L 28/60; H01L 29/861; H01L 29/8611;
(Continued)

(56) References Cited

U.S. PATENT DOCUMENTS 6,350,996 B1    2/2002  Kawai et al.
8,482,193 B2 *  7/2013  Kido .................. C07C 211/58
                                                    313/504
(Continued)

FOREIGN PATENT DOCUMENTS

EP       2 701 139 A1    2/2014
JP       2000-030872 A   1/2000
(Continued)

OTHER PUBLICATIONS

International Search Report of PCT/JP2017/027155 dated Oct. 24, 2017.
(Continued)

*Primary Examiner* — Eduardo A Rodela
(74) *Attorney, Agent, or Firm* — Sughrue Mion, PLLC

(57) ABSTRACT

The present invention provides an organic EL device that can ensure safety by automatic light emission of afterglow illumination even when the power is shut off due to a power failure, turning-off, or the like. The organic EL device of the present invention includes: a substrate; an organic EL element part; and a charge storage part, wherein the organic EL element part is disposed on one surface of the substrate, the charge storage part is disposed on the organic EL element part, the organic EL element part includes a pair of electrodes and an organic EL layer, and the organic EL layer is sealed inside so as to be shielded from the outside air by any of the substrate, the pair of electrodes of the organic EL element part, and the charge storage part.

5 Claims, 4 Drawing Sheets

(51) Int. Cl.

| | | |
|---|---|---|
| *H01L 51/52* | (2006.01) | |
| *H01L 29/861* | (2006.01) | |
| *H01L 29/92* | (2006.01) | |
| *H01L 49/02* | (2006.01) | |
| *H01L 51/50* | (2006.01) | |
| *H01L 27/02* | (2006.01) | |

(52) U.S. Cl.
CPC .......... *H01L 27/0688* (2013.01); *H01L 28/20* (2013.01); *H01L 28/40* (2013.01); *H01L 28/60* (2013.01); *H01L 29/861* (2013.01); *H01L 29/8613* (2013.01); *H01L 29/8616* (2013.01); *H01L 29/92* (2013.01); *H01L 51/50* (2013.01); *H01L 51/5253* (2013.01)

(58) Field of Classification Search
CPC . H01L 29/8613; H01L 29/8616; H01L 29/92; H01L 27/06; H01L 27/0688; H01L 27/0288; H01L 51/50
See application file for complete search history.

(56) References Cited

U.S. PATENT DOCUMENTS

| | | | | |
|---|---|---|---|---|
| 9,312,314 | B2* | 4/2016 | Hente | ................. H01L 51/5253 |
| 10,217,967 | B2* | 2/2019 | Kido | ................. C07C 211/58 |
| 2006/0284230 | A1* | 12/2006 | Yang | ................. B82Y 10/00 |
| | | | | 257/306 |
| 2007/0176552 | A1 | 8/2007 | Kwak | |
| 2012/0049725 | A1* | 3/2012 | Hente | ................. H01L 51/5203 |
| | | | | 313/503 |
| 2012/0262432 | A1* | 10/2012 | Kamata | ................. H05B 45/60 |
| | | | | 345/204 |
| 2013/0002126 | A1 | 1/2013 | Sakaguchi | |
| 2014/0131677 | A1* | 5/2014 | Oh | ................. H01L 27/3262 |
| | | | | 257/40 |
| 2014/0361279 | A1 | 12/2014 | Schicktanz et al. | |
| 2015/0228223 | A1* | 8/2015 | Park | ................. G09G 3/3208 |
| | | | | 345/77 |
| 2016/0020266 | A1* | 1/2016 | Park | ................. H01L 27/3262 |
| | | | | 257/40 |
| 2016/0064421 | A1* | 3/2016 | Oh | ................. H01L 27/1222 |
| | | | | 257/43 |
| 2016/0313769 | A1 | 10/2016 | Yoshitani et al. | |

FOREIGN PATENT DOCUMENTS

| | | |
|---|---|---|
| JP | 2002-063801 A | 2/2002 |
| JP | 2005-116252 A | 4/2005 |
| JP | 2005-135978 A | 5/2005 |
| JP | 2011-049411 A | 3/2011 |
| JP | 2012-231661 A | 11/2012 |
| JP | 2014-143148 A | 8/2014 |
| JP | 2015-510670 A | 4/2015 |
| JP | 2017-032975 A | 2/2017 |
| WO | 2011/136205 A1 | 11/2011 |
| WO | 2012/157075 A1 | 11/2012 |
| WO | 2013/114244 A1 | 8/2013 |

OTHER PUBLICATIONS

International Search Report of PCT/JP2017/025577 dated Oct. 10, 2017.

Communication dated Feb. 27, 2020 from the United States Patent and Trademark Office in U.S. Appl. No. 16/338,310.

Communication dated Jun. 23, 2020, from the Japanese Patent Office in Application No. 2018-550023.

* cited by examiner

ORGANIC EL DEVICE

CROSS REFERENCE TO RELATED APPLICATIONS

This application is a National Stage of International Application No. PCT/JP2017/027155 filed Jul. 27, 2017, claiming priority based on Japanese Patent Application No. 2016-220241 filed Nov. 11, 2016, the entire subject matter of which are incorporated herein by reference.

TECHNICAL FIELD

The present invention relates to an organic EL device.

BACKGROUND ART

An organic EL (Organic Electro-Luminescence) device is a self-emitting device equipped with an organic EL element (organic EL layer), which can be used, for example, as an illumination device, a light source, a display device, or the like (see, for example, Patent Literature 1).

CITATION LIST

Patent Literature

Patent Literature 1: WO 2011/136205 A1

SUMMARY OF INVENTION

Technical Problem

It is known that the organic EL device responds at a high speed, and the turning-on speed when the power is turned on is high as well as the turning-off speed when the power is turned off is high. For this reason, for example, depending on the use of the conventional organic EL device such as the illumination device or the like, it may be suddenly darkened in the event of a sudden power failure due to a disaster or the like or in the event of turning-off before bedtime, so that security cannot be ensured in some cases.

Hence, the present invention is intended to provide an organic EL device that can ensure safety by automatic light emission of afterglow illumination even when the power is shut off due to a power failure, turning-off, or the like.

Solution to Problem

In order to achieve the above object, the present invention provides a first organic EL device including: a substrate; an organic EL element part; and a charge storage part, wherein the organic EL element part is disposed on one surface of the substrate, the charge storage part is disposed on the organic EL element part, the organic EL element part includes a pair of electrodes and an organic EL layer, and the organic EL layer is sealed inside so as to be shielded from the outside air by any of the substrate, the pair of electrodes of the organic EL element part, and the charge storage part.

The present invention also provides a second organic EL device including: a substrate; an organic EL element part; a charge storage part; and a sealing film, wherein the charge storage part is disposed on one surface of the substrate, the organic EL element part is disposed on the charge storage part, the sealing film is disposed on the organic EL element part, the organic EL element part includes a pair of electrodes and an organic EL layer, and the organic EL layer is sealed inside so as to be shielded from the outside air by the pair of electrodes of the organic EL element part and the sealing film.

Advantageous Effects of Invention

The present invention can provide an organic EL device that can ensure safety by automatic light emission of afterglow illumination even when the power is shut off due to a power failure, turning-off, or the like.

DESCRIPTION OF EMBODIMENTS

In the present specification, the "first organic EL device" is referred to as a bottom emission type organic EL device, and the "second organic EL device" is referred to as a top emission type organic EL device.

The organic EL device of the present invention is described below with reference to the drawings. It is to be noted, however, that the present invention is by no means limited or restricted by the following example embodiments. In the following FIGS. 1A to 8, identical parts are indicated with identical reference signs. Furthermore, for convenience in explanation, the structure of each component shown in FIGS. 1A to 8 may be appropriately simplified, and the size, the ratio, and the like of components may be schematically shown and different from actual ones. Regarding the descriptions of the example embodiments, reference can be made to one another unless otherwise stated.

First Example Embodiment

Figure 1A:
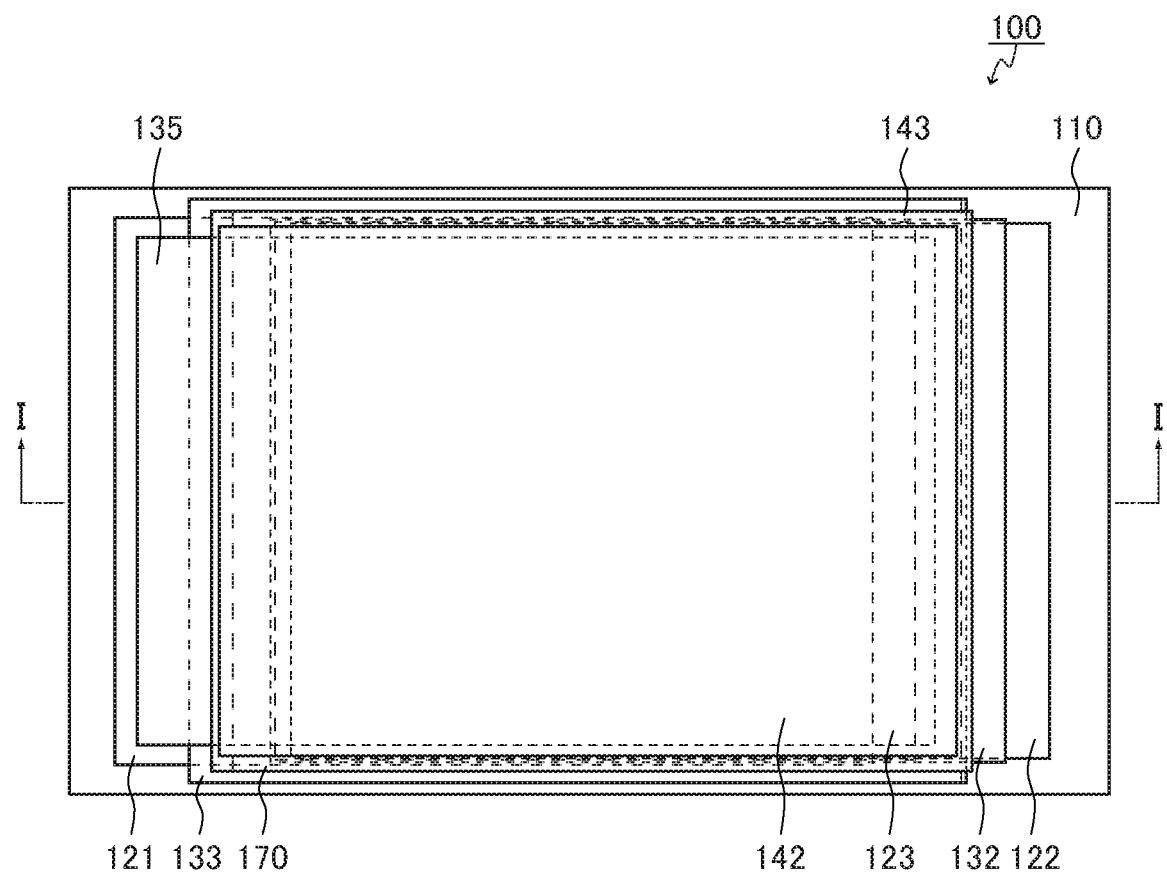
FIG. 1A is a plan view showing an exemplary configuration of the organic EL device according to the first example embodiment.
Figure 1B:
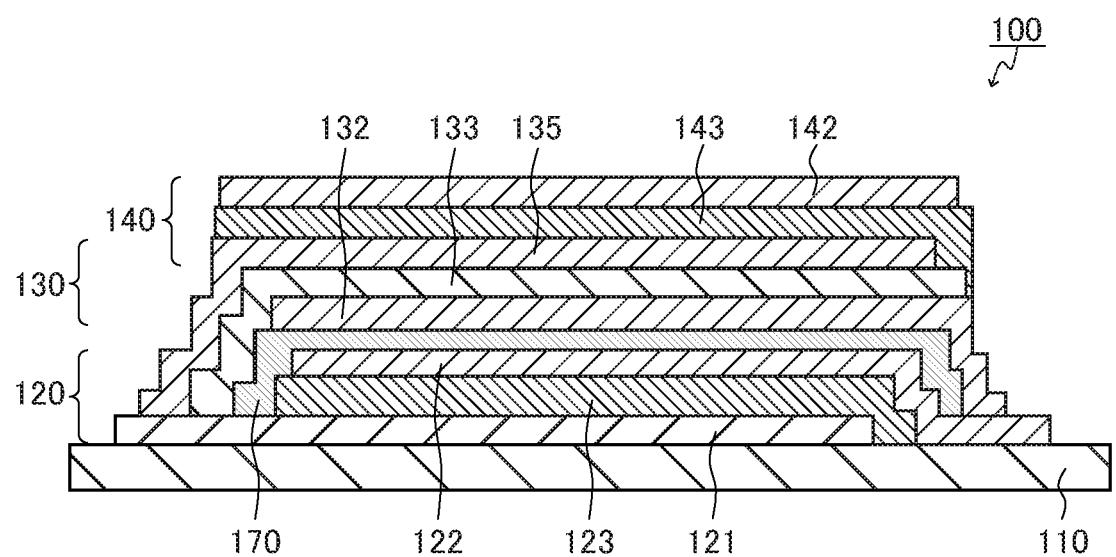
FIG. 1B is a cross-sectional view of the organic EL device shown in FIG. 1A taken along the line I-I.

The first example embodiment is an example of the first organic EL device (bottom emission type organic EL device) of the present invention. FIGS. 1A and 1B shows an organic EL device of the present example embodiment. FIG. 1A is a plan view showing an exemplary configuration of the organic EL device of the present example embodiment, and FIG. 1B is a cross-sectional view of the organic EL device shown in FIG. 1A taken along the line I-I. As shown in FIGS. 1A and 1B, the organic EL device 100 of the present example embodiment includes a substrate 110, an organic EL element part 120, a charge storage part 130, and a rectification part 140. The organic EL element part 120 is disposed on one surface (the upper surface in FIGS. 1A and 1B) of the substrate 110. The charge storage part 130 is disposed on the organic EL element part 120. The organic EL element part 120 includes a pair of electrodes 121 and 122 and an organic EL layer 123. The organic EL layer 123 is sealed inside so as to be shielded from the outside air by any of the substrate 110, the pair of electrodes 121 and 122 of the organic EL element part 120, and the charge storage part 130. Details of the configuration of the organic EL element part 120 and the sealing of the organic EL layer 123 are described below. The rectification part 140 is optional, and the organic EL device 100 may or may not include the rectification part 140. In FIGS. 1A and 1B, the order of stacking the charge storage part 130 and the rectification part 140 may be changed. While FIGS. 1A and 1B show the organic EL device 100 having a rectangular planar shape, the planar shape of the organic EL device is not limited to this example, and examples thereof include a polygonal shape other than a rectangular shape such as a parallelogram shape other than a rectangular shape (including a square shape and a rhombus shape), a trapezoid shape, a pentagon shape, a hexagon shape, or the like; a circular shape; an elliptical shape; and a shape close to them (for example, a substantially rectangular shape). In the present invention, as to the light emission of the organic EL element part 120, the light emission by normal energization is referred to as main illumination and the light emission by power supply from the charge storage part 130 is referred to as sub illumination or afterglow illumination.

The substrate 110 preferably has a high transmittance for transmitting light emitted from the organic EL layer 123. Examples of the material for forming the substrate 110 include glass such as alkali-free glass, soda glass, soda lime glass, borosilicate glass, aluminosilicate glass, quartz glass, or the like; polyester such as polyethylene naphthalate, polyethylene terephthalate, or the like; polyimide; an acrylic resin such as polymethyl methacrylate, polyethyl methacrylate, polymethyl acrylate, polyethyl acrylate, or the like; polyether sulfone; and polycarbonate ester. The size (length and width) of the substrate 110 is not particularly limited, and may be appropriately set, for example, depending on the size of a desired organic EL device 100. The thickness of the substrate 110 is not particularly limited, and may be appropriately set depending on the forming material, the use environment, and the like, and is generally not more than 1 mm.

The pair of electrodes 121 and 122 of the organic EL element part 120 is, for example, the combination of an anode 121 and a cathode 122, the anode 121 is, for example, a transparent electrode such as indium tin oxide (ITO), and the cathode 122 is, for example, a counter electrode such as a metal (e.g., aluminum). The organic EL layer 123 is, for example, a laminate in which a hole injection layer, a hole transport layer, a light-emitting layer including an organic EL, an electron transport layer, and an electron injection layer are sequentially stacked. In the case of the bottom emission type organic EL device 100 of the present example embodiment, as shown in FIGS. 1A and 1B, the organic EL element part 120 is preferably a laminate in which the transparent electrode (anode) 121, the organic EL layer 123, and the counter electrode (cathode) 122 are stacked in this order from the side of the substrate 110, for example. While FIGS. 1A and 1B show an example in which one organic EL element part 120 (organic EL layer 123) is disposed on one surface of the substrate 110, the organic EL device 100 of the present example embodiment is not limited to this example, and a plurality (two or more) of organic EL element parts (organic EL layers) may be disposed on one surface of the substrate 110.

As shown in FIGS. 1A and 1B, a planarization insulating film 170 may further be disposed between the organic EL element part 120 and the charge storage part 130. By disposing the planarization insulating film 170, leveling of a layer stacked thereon can be improved, and occurrence of defects such as luminance unevenness, short-circuiting, dielectric breakdown, and the like can be prevented. Examples of the planarization insulating film 170 include a thin film of metal oxide such as aluminum oxide, a thin film of inorganic oxide such as silicon oxide, a thin film of inorganic nitride such as silicon nitride, and a thin film of an organic material. The planarization insulating film 170 is optional, and the organic EL device 100 may or may not include the planarization insulating film 170.

The charge storage part 130 includes a pair of electrodes and a dielectric, and is a laminate in which one of the pair of electrodes, the dielectric, and the other of the pair of electrodes are stacked in this order, for example. The pair of electrodes is, for example, the combination of an electrode film 135 and an electrode film 132. While FIGS. 1A and 1B show an example of the organic EL device 100 in which the charge storage part 130 shares the electrode film 135 with the rectification part 140 to be described below, the electrode film only for the charge storage part 130 and the electrode film only for the rectification part 140 may be provided separately. The electrode film 135 and the electrode film 132 may be electrodes such as metals as those in the cathode 122 of the organic EL element part 120. Examples of the dielectric 133 include a thin film of metal oxide such as aluminum oxide, a thin film of inorganic oxide such as silicon oxide, a thin film of inorganic nitride such as silicon nitride, and a thin film of inorganic oxynitride such as silicon oxynitride. The material for forming the organic EL layer 123 can also serve as a dielectric having a dielectric constant, and thus may be used for forming the charge storage part 130. In this case, when an injection material for holes or electrons is used, a barrier for carriers injecting into the materials is small and the charge is less prone to be stored. Therefore, it is preferable to use a host material for a hole transport layer, a light-emitting layer, or an electron transport layer instead of the injection material for holes or electrons. Alternatively, the hole injection layer and the electron injection layer may be formed in the opposite order to that in the organic EL layer 123.

The electrodes of the same potential in the respective parts of the organic EL device 100 may be electrically connected to each other at least at one end in the plane direction thereof. In FIGS. 1A and 1B, the anode 121 of the organic EL element part 120 and the electrode film 135 of the charge storage part 130 are electrically connected on the left end side of FIG. 1B, and the cathode 122 of the organic EL element part 120 and the electrode film 132 of the charge storage part 130 are electrically connected on the right end side of FIG. 1B. This is, however, an example, and the present invention is not limited thereto. In the present invention, the anode 121 and the electrode film 135 may be electrically connected to each other on the right end side of FIG. 1B, the upper end side of FIG. 1A, or the lower end side of FIG. 1A in addition to or instead of the left end side of FIG. 1B, and the cathode 122 and the electrode film 132 may be electrically connected to each other on the left end side of FIG. 1B, the upper end side of FIG. 1A, or the lower end side of FIG. 1A in addition to or instead of the right end side of FIG. 1B. The same applies to the electrodes of the same potential in the respective parts of the organic EL device 100 thereafter.

As shown in FIGS. 1A and 1B, the organic EL layer 123 is sealed inside so as to be shielded from the outside air by the substrate 110, the anode 121, the cathode 122, and the charge storage part 130. In the organic EL device 100 of the present example embodiment, the configuration of sealing the organic EL layer 123 inside so as to be shielded from the outside air is not limited to the examples shown in FIGS. 1A and 1B, and other configurations may be used.

The rectification part 140 includes a pair of electrodes and an organic film, and is a laminate in which one of the pair of electrodes, the organic film, and the other of the pair of electrodes are stacked in this order, for example. The pair of electrodes is, for example, the combination of the electrode film 135 and an electrode film 142. For example, the electrode film 142 may be electrodes such as metals as those in the cathode 122 of the organic EL element part 120. The organic film 143 is made of, for example, a unipolar material. The configuration of the organic film 143 may be the same as that of the hole transport layer or the electron transport layer in the organic EL layer 123, for example. When a positive potential is applied to the electrode film 142, for example, the hole transport layer may be used as the organic film 143.

The method of manufacturing the organic EL device 100 of the present example embodiment is described below with reference to examples. This manufacturing method, however, is merely an example, and the organic EL device 100 of the present example embodiment may be manufactured by any method.

First, the anode 121 is formed on one surface of the substrate 110. The anode 121 can be formed through a shadow mask, for example, by forming a film with the material for forming the anode 121 by a conventionally known method such as a sputtering method, a chemical vapor deposition (CVD) method, or the like. The anode 121 can also be formed by forming a film uniformly with the material for forming the anode 121 on one surface of the substrate 110 and patterning the film into a desired shape by photolithography.

Next, the organic EL layer 123 is formed on the anode 121. The organic EL layer 123 can be formed with a conventionally known material through a shadow mask by a conventionally known method such as a vacuum deposition method by resistance heating, an MBE (Molecular Beam Epitaxy) method, a laser ablation method, or the like. When a polymer material is used for forming the organic EL layer 123, the organic EL layer 123 can be formed on the anode 121 by printing such as ink-jet printing with the polymer material in a liquid state; or the organic EL layer 123 can be formed on the anode 121 by photolithography by preparing a photosensitive coating liquid from the polymer material followed by spin coating or slit coating.

Next, the cathode 122 is formed on the organic EL layer 123. The cathode 122 can be formed, for example, with the material for forming the cathode 122 by a conventionally known method such as a vacuum deposition method, a sputtering method, or the like.

Next, the planarization insulating film 170 is formed on the cathode 122. The planarization insulating film 170 can be formed with the material for forming the planarization insulating film 170 by a sputtering method or the like, for example.

Next, the electrode film 132 is formed on the planarization insulating film 170 in the same manner as the formation of the cathode 122 described above.

Next, the dielectric 133 is formed on the electrode film 132 with the material for forming the dielectric 133 in the same manner as the formation of the planarization insulating film 170 described above.

Next, the electrode film 135 is formed on the dielectric 133 in the same manner as the formation of the cathode 122 described above.

Next, the organic film 143 is formed on the electrode film 135 in the same manner as the formation of the organic EL layer 123 described above.

Next, the electrode film 142 is formed on the organic film 143 in the same manner as the formation of the cathode 122 described above.

Figure 2:
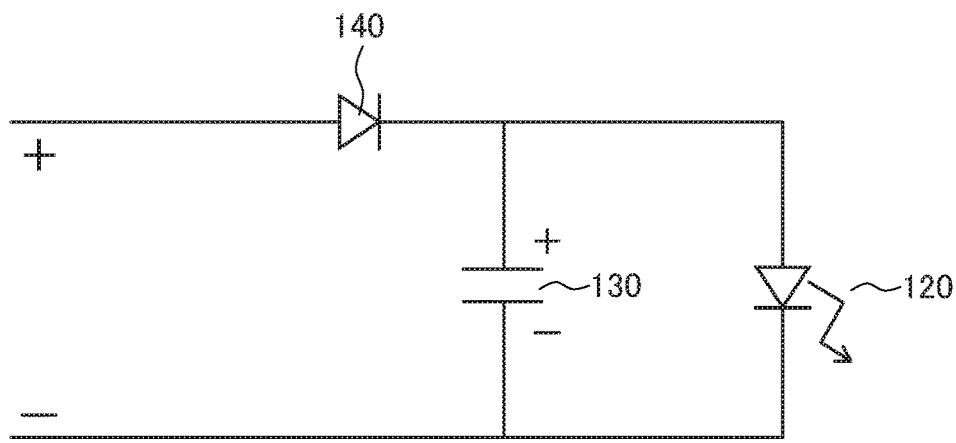
FIG. 2 is an equivalent circuit diagram of an example of the organic EL device according to the first example embodiment.

FIG. 2 is an equivalent circuit diagram of the organic EL device 100 of the present example embodiment. In FIG. 2, the "+" at the upper left and the "−" at the lower left indicate the types of electric power supplied from an external power source. The "+" indicates that the electrode film 142 in FIGS. 1A and 1B is electrically connected thereto. The "−" indicates that the cathode 122 and the electrode film 132 in FIGS. 1A and 1B are electrically connected thereto. According to the organic EL device 100 of the present example embodiment, electricity is stored in the charge storage part 130 when the organic EL layer 123 is turned on and emits light (main illumination). It is to be noted, when the power is shut off due to a power failure, turning-off, or the like, the main illumination cannot be turned on. In such a case, the sub-illumination mode is switched on, and the electrical energy stored in the charge storage part 130 is supplied to the organic EL layer 123 and the organic EL layer 123 can be illuminated for a certain period of time.

As described above, by providing the charge storage part 130 that supplies the stored electrical energy to the organic EL layer 123, the organic EL device 100 of the present example embodiment can forcibly cause the organic EL layer 123 to emit light by using the stored electrical energy at the time of a power failure or turning-off, for example. In other words, automatic illumination at the time of a power failure or turning-off is also possible, so that safety can be ensured.

In a general organic EL device, in order to protect the organic EL layer 123 from deterioration such as oxidation, the organic EL layer 123 is capped with a sealing substrate facing the substrate 110 so as to be shielded from the outside air, and a gap between the substrate 110 and the sealing substrate is filled with a filler such as an inert gas, silicone, or the like. On the other hand, in the organic EL device 100 of the present example embodiment, as described above, the organic EL layer 123 is sealed inside so as to be shielded from the outside air by any of the substrate 110, the pair of electrodes 121 and 122 of the organic EL element part 120, and the charge storage part 130. Thus, the organic EL device 100 of the present example embodiment does not require the sealing substrate and the filler, so that the thickness can be reduced. In addition, the organic EL device 100 of the present example embodiment does not require the steps of forming the sealing substrate and the filler, so that the manufacturing process can be simplified. Furthermore, since the charge storage part 130 and the rectification part 140 are sequentially stacked on the organic EL element part 120 in the organic EL device 100 of the present example embodiment, the area of the organic EL layer 123 on one surface of the substrate 110 can be increased. As a result, the lighting area and the luminous flux can be increased.

The organic EL device 100 of the present example embodiment can be, for example, used in a wide range of applications such as illumination devices, light sources, display devices, and the like.

Second Example Embodiment

Figure 3:
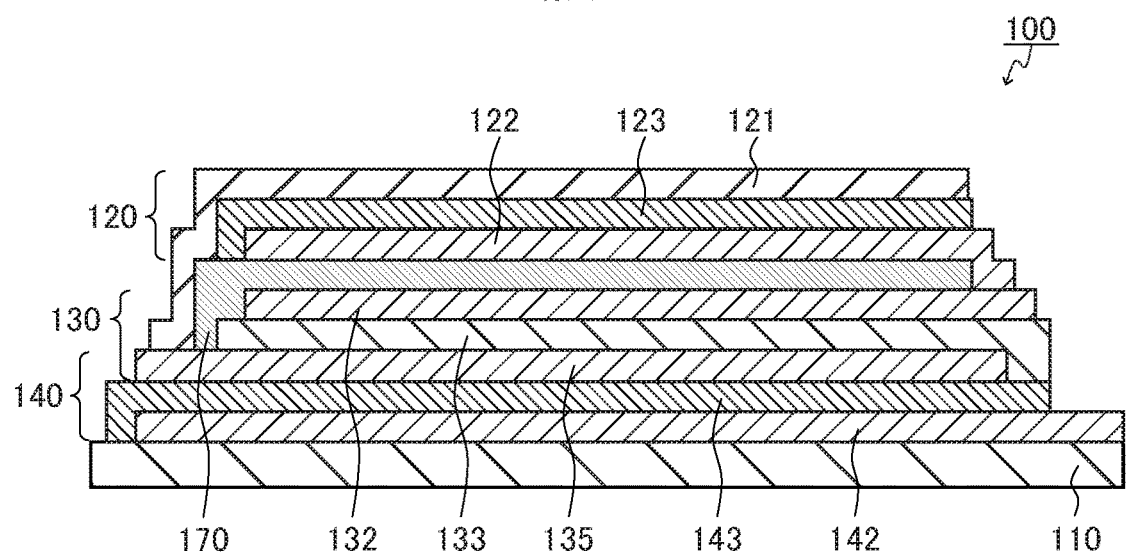
FIG. 3 is a cross-sectional view of an exemplary configuration of the organic EL device according to the second example embodiment.

The second example embodiment is an example of the second organic EL device (top emission type organic EL device) of the present invention. FIG. 3 is a cross-sectional view showing the organic EL device of the present example embodiment. As shown in FIG. 3, the organic EL device 100 of the present example embodiment includes a substrate 110, an organic EL element part 120, a planarization insulating film 170, a charge storage part 130, and a rectification part 140, and the planarization insulating film 170 and the rectification part 140 are optional as in the first example embodiment. It is to be noted that, the organic EL element part 120, the planarization insulating film 170, the charge storage part 130, and the rectification part 140 are stacked in this order from the side of the substrate 110 in the first example embodiment, whereas, in the present example embodiment, the rectification part 140, the charge storage part 130, the planarization insulating film 170, and the organic EL element part 120 are stacked in this order from the side of the substrate 110, which is the reverse order of the first example embodiment, and the upper and lower sides of the respective parts are also the reverse of those of the first example embodiment. That is, in the first example embodiment, the anode 121, the organic EL layer 123, the cathode 122, the planarization insulating film 170, the electrode film 132, the dielectric 133, the electrode film 135, the organic film 143, and the electrode film 142 are stacked in this order from the side of the substrate 110 as shown in FIG. 1B, whereas, in the present example embodiment, the electrode film 142, the organic film 143, the electrode film 135, the dielectric 133, the electrode film 132, the planarization insulating film 170, the cathode 122, the organic EL layer 123, and the anode 121 are laminated in this order from the side of the substrate 110 as shown in FIG. 3. In FIG. 3, the order of stacking the rectification part 140 and the charge storage part 130 may be changed. Although it is not shown in FIG. 3, in the organic EL device 100 of the present example embodiment, a sealing film is further disposed on the anode 121 so as to shield the right end side of the organic EL layer 123 in FIG. 3 from the outside air. Examples of the sealing film include a silicon oxide film, and a silicon oxynitride film.

While the present example embodiment is not shown in a plan view, the organic EL layer 123 is sealed inside by the cathode 122, the anode 121, and the sealing film so as to be shielded from the outside air.

The method of manufacturing the organic EL device 100 of the present example embodiment is described below with reference to examples. This manufacturing method, however, is merely an example, and the organic EL device 100 of the present example embodiment may be manufactured by any method.

First, the electrode film 142 is formed on one surface of the substrate 110. The electrode film 142 can be formed, for example, with the material for forming the electrode film 142 by a conventionally known method such as a vacuum deposition method, a sputtering method, or the like.

Next, the organic film 143 is formed on the electrode film 142. The organic film 143 can be formed with a conventionally known material through a shadow mask by a conventionally known method such as a vacuum deposition method by resistance heating, an MBE (Molecular Beam Epitaxy) method, a laser ablation method, or the like. When a polymer material is used for forming the organic film 143, the organic film 143 may be formed on the electrode film 142 by printing such as ink-jet printing with the polymer material in a liquid state.

Next, the electrode film 135 is formed on the organic film 143 in the same manner as the formation of the electrode film 142 described above.

Next, the dielectric 133 is formed on the electrode film 135. The dielectric 133 can be formed with the material for forming the dielectric 133 by a sputtering method or the like, for example.

Next, the electrode film 132 is formed on the dielectric 133 in the same manner as the formation of the electrode film 142 described above.

Next, the planarization insulating film 170 is formed on the electrode film 132 with the material for forming the planarization insulating film 170 in the same manner as the formation of the dielectric 133 described above.

Next, the cathode 122 is formed on the planarization insulating film 170 in the same manner as the formation of the electrode film 142 described above.

Next, the organic EL layer 123 is formed on the cathode 122 in the same manner as the formation of the organic film 143 described above.

Next, the anode 121 is formed on the organic EL layer 123 by forming a film with the material for forming the anode 121 by a conventionally known method such as a sputtering method, a chemical vapor deposition (CVD) method, or the like.

Next, the sealing film is formed on the anode 121 with the material for forming the sealing film in the same manner as the formation of the dielectric 133 described above.

The equivalent circuit diagram of the organic EL device 100 of the present example embodiment is the same as the equivalent circuit diagram of the first example embodiment shown in FIG. 2. The "+" at the upper left of FIG. 2 indicates that the electrode film 142 in FIG. 3 is electrically connected thereto. The "−" at the lower left of FIG. 2 indicates that the cathode 122 and the electrode film 132 in FIG. 3 are electrically connected thereto. According to the organic EL device 100 of the present example embodiment, electricity is stored in the charge storage part 130 when the organic EL layer 123 is turned on and emits light (main illumination) as in the first example embodiment. It is to be noted, when the power is shut off due to a power failure, turning-off, or the like, the main illumination cannot be turned on. In such a case, the sub-illumination mode is switched on, and the electrical energy stored in the charge storage part 130 is supplied to the organic EL layer 123 and the organic EL layer 123 can be illuminated for a certain period of time.

As described above, by providing the charge storage part 130 that supplies the stored electrical energy to the organic EL layer 123, the organic EL device 100 of the present example embodiment can forcibly cause the organic EL layer 123 to emit light by using the stored electrical energy at the time of a power failure or turning-off, for example, as in the first example embodiment. In other words, automatic illumination at the time of a power failure or turning-off is also possible, so that safety can be ensured.

In the organic EL device 100 of the present example embodiment, as described above, the organic EL layer 123 is sealed inside so as to be shielded from the outside air by the pair of electrodes 121 and 122 of the organic EL element part 120 and the sealing film. Thus, the organic EL device 100 of the present example embodiment does not require the sealing substrate and the filler, so that the thickness can be reduced as in the first example embodiment. In addition, the organic EL device 100 of the present example embodiment does not require the steps of forming the sealing substrate and the filler, so that the manufacturing process can be simplified as in the first example embodiment. Furthermore, since the charge storage part 130 and the organic EL element part 120 are sequentially stacked on the rectification part 140 in the organic EL device 100 of the present example embodiment, the area of the organic EL layer 123 on one surface of the substrate 110 can be increased. As a result, the lighting area and the luminous flux can be increased.

The organic EL device 100 of the present example embodiment can be, for example, used in a wide range of applications such as illumination devices, light sources, display devices, and the like as in the first example embodiment.

Third Example Embodiment

Figure 4:
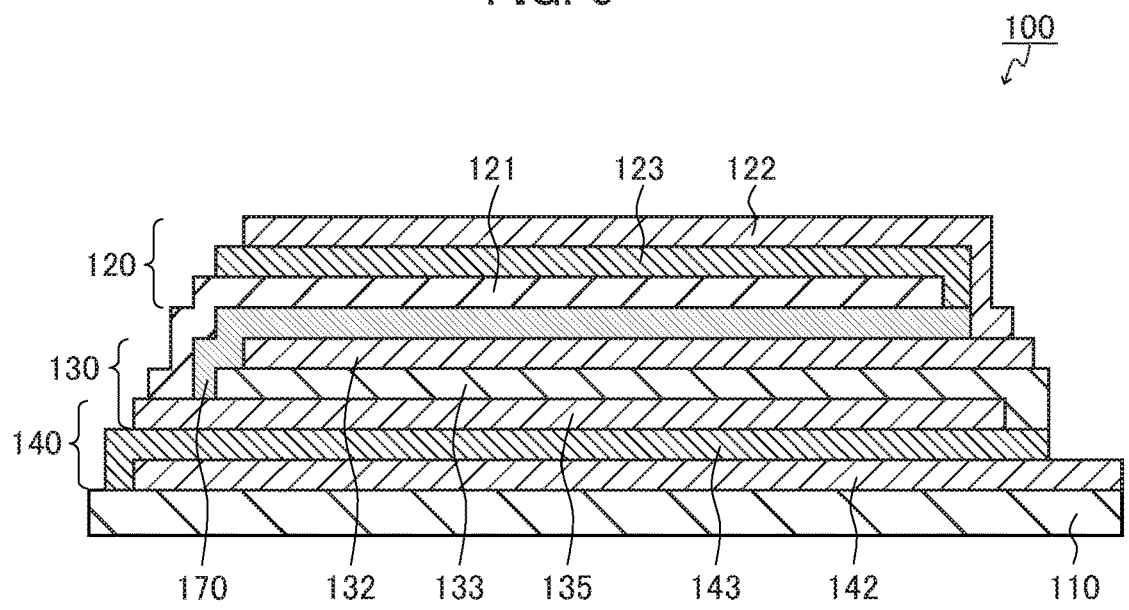
FIG. 4 is a cross-sectional view of an exemplary configuration of the organic EL device according to the third example embodiment.

The third example embodiment is another example of the second organic EL device (top emission type organic EL device) of the present invention. FIG. 4 is a cross-sectional view showing the organic EL device of the present example embodiment. As shown in FIG. 4, the organic EL device 100 of the present example embodiment is the same as the organic EL device 100 of the second example embodiment except that the order of stacking the layers of the organic EL element part 120 is different. That is, in the second example embodiment, the organic EL element part 120 is a laminate in which the cathode 122, the organic EL layer 123, and the anode 121 are stacked in this order from the side of the planarization insulating film 170, whereas, in the present example embodiment, the anode 121, the organic EL layer 123, and the cathode 122 are stacked in this order from the side of the planarization insulating film 170. In the present example embodiment, the cathode 122 is formed of a translucent material. The translucent material is not particularly limited, and examples thereof include a translucent electrode used in an OLED (organic light emitting diode) display and aluminium having a thickness of several tens of nanometers. Although it is not shown in FIG. 4, in the organic EL device 100 of the present example embodiment, a sealing film is further disposed on the cathode 122 so as to shield the left end side of the organic EL layer 123 in FIG. 4 from the outside air. Examples of the sealing film include a silicon oxide film and a silicon oxynitride film.

While the present example embodiment is not shown in a plan view, the organic EL layer 123 is sealed inside by the anode 121, the cathode 122, and the sealing film so as to be shielded from the outside air.

The method of manufacturing the organic EL device 100 of the present example embodiment is described below with reference to examples. This manufacturing method, however, is merely an example, and the organic EL device 100 of the present example embodiment may be manufactured by any method.

First, the electrode film 142, the organic film 143, the electrode film 135, the dielectric 133, the electrode film 132, and the planarization insulating film 170 are sequentially formed on one surface of the substrate 110 in the same manner as the second example embodiment.

Next, the anode 121 is formed on the planarization insulating film 170 by forming a film with the material for forming the anode 121 by a conventionally known method such as a sputtering method, a chemical vapor deposition (CVD) method, or the like.

Next, the organic EL layer 123 is formed on the anode 121 in the same manner as the formation of the organic film 143 described above.

Next, the cathode 122 is formed on the organic EL layer 123 in the same manner as the formation of the electrode film 142 described above.

Next, the sealing film is formed on the cathode 122 with the material for forming the sealing film in the same manner as the formation of the dielectric 133 described above.

The equivalent circuit diagram of the organic EL device 100 of the present example embodiment is the same as the equivalent circuit diagram of the first example embodiment shown in FIG. 2. The "+" at the upper left of FIG. 2 indicates that the electrode film 142 in FIG. 4 is electrically connected thereto. The "−" at the lower left of FIG. 2 indicates that the cathode 122 and the electrode film 132 in FIG. 4 are electrically connected thereto. According to the organic EL device 100 of the present example embodiment, electricity is stored in the charge storage part 130 when the organic EL layer 123 is turned on and emits light (main illumination) as in the first and second example embodiments. It is to be noted, when the power is shut off due to a power failure, turning-off, or the like, the main illumination cannot be turned on. In such a case, the sub-illumination mode is switched on, and the electrical energy stored in the charge storage part 130 is supplied to the organic EL layer 123 and the organic EL layer 123 can be illuminated for a certain period of time.

As described above, by providing the charge storage part 130 that supplies the stored electrical energy to the organic EL layer 123, the organic EL device 100 of the present example embodiment can forcibly cause the organic EL layer 123 to emit light by using the stored electrical energy at the time of a power failure or turning-off, for example, as in the first and second example embodiments. In other words, automatic illumination at the time of a power failure or turning-off is also possible, so that safety can be ensured.

In the organic EL device 100 of the present example embodiment, as described above, the organic EL layer 123 is sealed inside so as to be shielded from the outside air by the pair of electrodes 121 and 122 of the organic EL element part 120 and the sealing film. Thus, the organic EL device 100 of the present example embodiment does not require the sealing substrate and the filler, so that the thickness can be reduced as in the first and second example embodiments. In addition, the organic EL device 100 of the present example embodiment does not require the steps of forming the sealing substrate and the filler, so that the manufacturing process can be simplified as in the first and second example embodiments. Furthermore, since the charge storage part 130 and the organic EL element part 120 are sequentially stacked on the rectification part 140 in the organic EL device 100 of the present example embodiment, the area of the organic EL layer 123 on one surface of the substrate 110 can be increased. As a result, the lighting area and the luminous flux can be increased.

Fourth Example Embodiment

Figure 5:
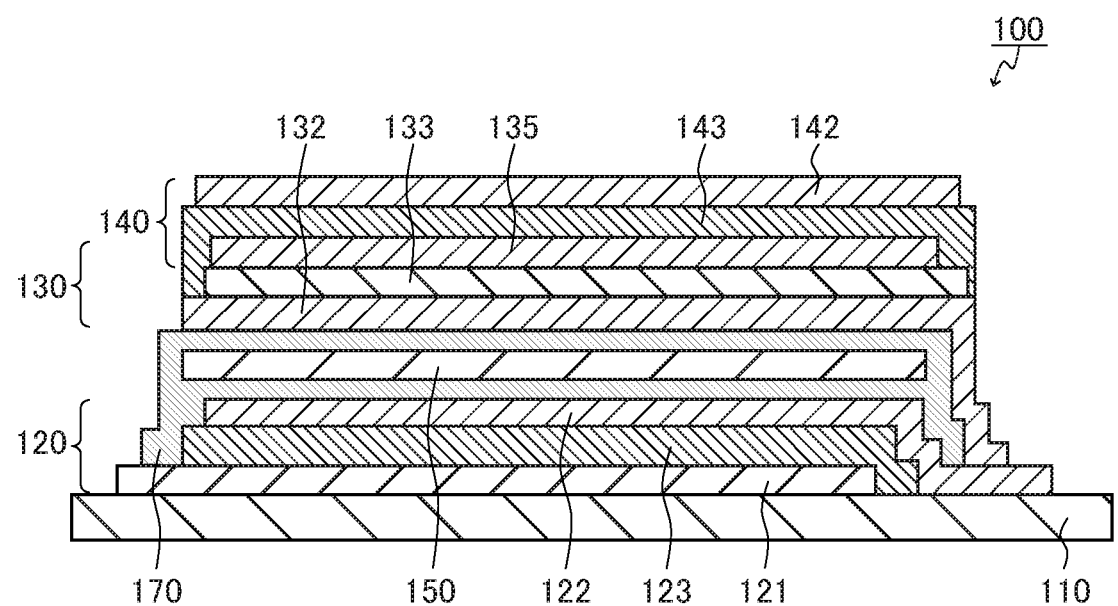
FIG. 5 is a cross-sectional view of an exemplary configuration of the organic EL device according to the fourth example embodiment.

The fourth example embodiment is another example of the first organic EL device (bottom emission type organic EL device) of the present invention. FIG. 5 is a cross-sectional view showing the organic EL device of the present example embodiment. As shown in FIG. 5, the organic EL device 100 of the present example embodiment is the same as the organic EL device 100 of the first example embodiment except that the planarization insulating film 170 has a different shape and the organic EL device 100 includes a current adjustment part 150 that adjusts the current supplied from the charge storage part 130 to the organic EL element part 120. That is, in the present example embodiment, the current adjustment part 150 is formed on the planarization insulating film 170, and the planarization insulating film 170 is formed again on the current adjustment part 150, so that the current adjustment part 150 is sandwiched between the planarization insulating films 170. While, the present example embodiment is not shown in a plan view, with reference to a plan view (FIG. 1A) of the first example embodiment, the current adjustment part 150 is electrically connected to the anode 121 on one of the upper end side and the lower end side in FIG. 1A, and is electrically connected to the electrode film 135 on the other of the upper end side and the lower end side in FIG. 1A. Examples of the current adjustment part 150 include materials having high contact resistance and materials having high resistivity such as Ta (tantalum), Cu—Ni (copper-nickel alloy), ITO, IZO (indium oxide-zinc oxide), IGZO (amorphous semiconductor composed of indium, gallium, zinc, and oxygen), and Ni—Cr (nickel-chromium alloy). The resistance value of the current adjustment part 150 can be selected and set depending on, for example, the voltage value of the external power supply, the difference of the voltage value between the external power supply and the organic EL device 100 or the rectification part 140 thereof, the degree of brightness of the organic EL device 100, and the like. As an example, when fourteen organic EL devices 100 each including an organic EL layer 123 driven at 6 V per layer and a rectification part 140 of 0.6 V are connected in series using an external power source having a voltage of 100 V and driven at about 80% of the voltage of the external power source, the resistance value of the current adjustment part 150 can be, for example, in the range from 30Ω to 40Ω. Since the driving voltage of the organic EL layer 123 gradually rises with small variation range due to continuous driving, it is preferable to drive the organic EL layer 123 in consideration of the voltage of the external power supply.

The method of manufacturing the organic EL device 100 of the present example embodiment is described below with reference to examples. This manufacturing method, however, is merely an example, and the organic EL device 100 of the present example embodiment may be manufactured by any method.

First, the anode 121, the organic EL layer 123, and the cathode 122 are sequentially formed on one surface of the substrate 110 in the same manner as in the first example embodiment.

Next, the planarization insulating film 170 is formed on the cathode 122. The planarization insulating film 170 can be formed with, for example, the material for forming the planarization insulating film 170 by a sputtering method or the like.

Next, the current adjustment part 150 is formed on the planarization insulating film 170. The current adjustment part 150 can be formed with, for example, the material for forming the current adjustment part 150 by a sputtering method, a vacuum deposition method, or the like.

Next, the planarization insulating film 170 is formed again on the current adjustment part 150.

Next, the electrode film 132, the dielectric 133, the electrode film 135, the organic film 143, and the electrode film 142 are sequentially formed on the planarization insulating film 170 in the same manner as in the first example embodiment.

Figure 6:
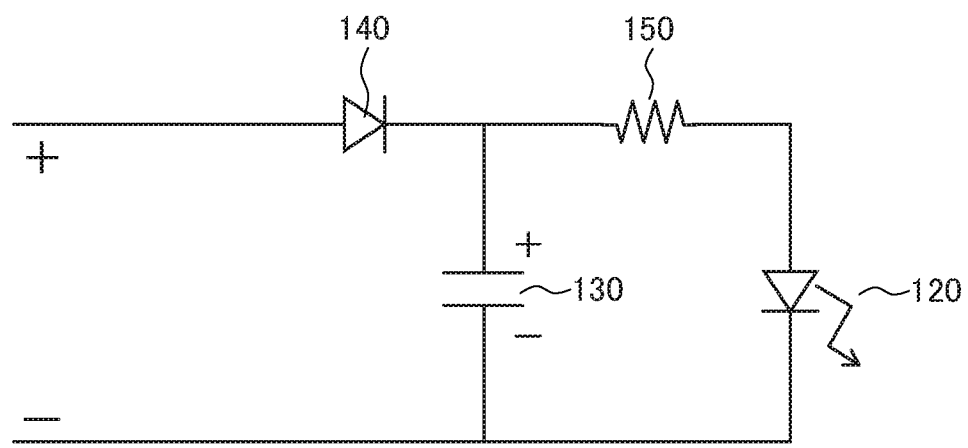
FIG. 6 is an equivalent circuit diagram of an example of the organic EL device according to the fourth example embodiment.

FIG. 6 is an equivalent circuit diagram of the organic EL device 100 of the present example embodiment. In FIG. 6, the "+" at the upper left and the "−" at the lower left indicate the types of electric power supplied from an external power source. The "+" indicates that the electrode film 142 in FIG. 5 is electrically connected thereto. The "−" indicates that the cathode 122 and the electrode film 132 in FIG. 5 are electrically connected thereto.

In addition to the effect obtained in the first example embodiment, by providing the current adjustment part 150, the organic EL device 100 of the present example embodiment can adjust and control the time for illuminating the sub illumination longer by reducing the current supplied from the charge storage part 130 to the organic EL element part 120 to increase the time constant. In addition, the current adjustment part 150 can also act to prevent a rush current from the charge storage part 130 to the organic EL element part 120 from being generated and to protect the organic EL element part 120.

While FIG. 5 shows the organic EL device 100 in which the current adjustment part 150 is sandwiched between the planarization insulating films 170, the current adjustment part 150 may be disposed at any position on one surface of the substrate 110 in the organic EL device 100 of the present example embodiment. Furthermore, while the present example embodiment shows an example in which the bottom emission type organic EL device of the first example embodiment further includes a current adjustment part, the top emission type organic EL devices of the second and third example embodiments can also bring about the same effect as in the present example embodiment by including a current adjustment part at any position on one surface of the substrate 110.

Fifth Example Embodiment

Figure 7:
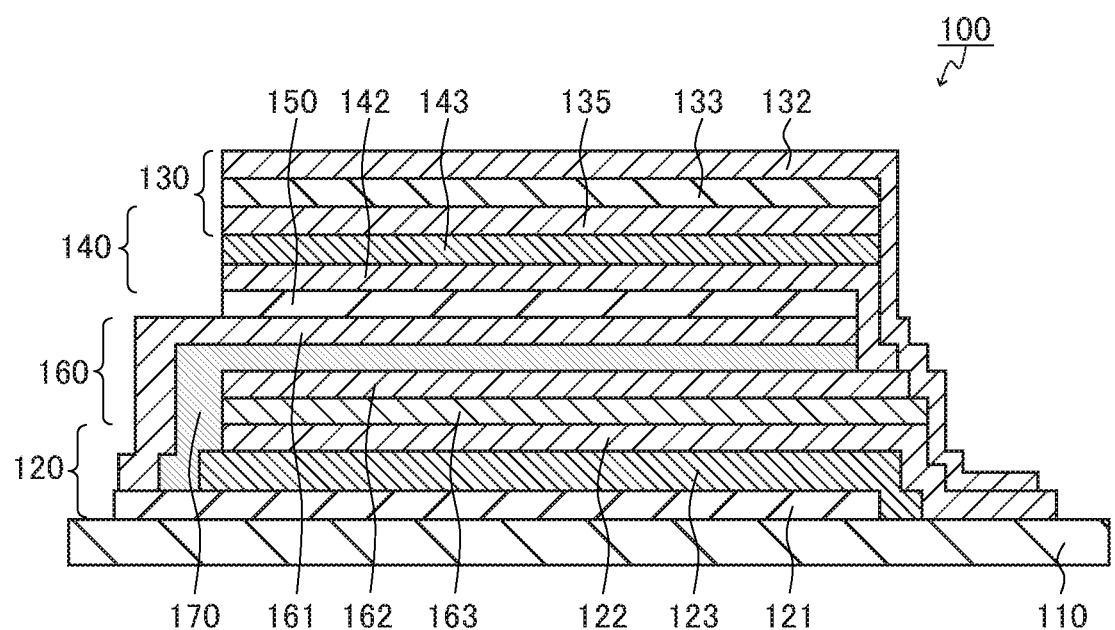
FIG. 7 is a cross-sectional view of an exemplary configuration of the organic EL device according to the fifth example embodiment.

The fifth example embodiment is still another example of the first organic EL device (bottom emission type organic EL device) of the present invention. FIG. 7 is a cross-sectional view showing the organic EL device of the present example embodiment. As shown in FIG. 7, the organic EL device 100 of the present example embodiment includes the substrate 110, the organic EL element part 120, the planarization insulating film 170, the current adjustment part 150, the charge storage part 130, and the rectification part 140 as in the fourth example embodiment. In addition, as in the fourth example embodiment, the planarization insulating film 170 and the rectification part 140 are optional in the present example embodiment. The organic EL device 100 of the present example embodiment, however, further includes a unipolar element 160. Furthermore, the organic EL element part 120, the planarization insulating film 170, the current adjustment part 150, the charge storage part 130, and the rectification part 140 are stacked in this order from the side of the substrate 110 in the fourth example embodiment, whereas, in the present example embodiment, the organic EL element part 120, the unipolar element 160, the current adjustment part 150, the rectification part 140, and the charge storage part 130 are stacked in this order from the side of the substrate 110. In the present example embodiment, the planarization insulating film 170 enters the inside of the unipolar element 160.

The unipolar element 160 is, for example, a laminate in which the organic film 163, the electrode film 162, the planarization insulating film 170, and the electrode film 161 are stacked in this order. The configuration of the organic film 163 is the same as that of the organic EL layer 123, for example. The electrode film 162 and the electrode film 161 may be electrodes such as metals as those in the cathode 122 of the organic EL element part 120.

While FIG. 7 shows as if the electrode film 162 and the electrode film 132 are partially in contact with each other, in fact, the electrode film 162 and the electrode film 132 are insulated from each other by the same material as the planarization insulating film 170 or the like, and the electrode film 162 is electrically connected only to the electrode film 142. Furthermore, while FIG. 7 shows as if the electrode film 161 and the electrode film 142 are partially in contact with each other, in fact, the electrode film 161 and the electrode film 142 are insulated from each other by the same material as the planarization insulating film 170 or the like, and the electrode film 161 is electrically connected only to the anode 121. Furthermore, while FIG. 7 shows as if the electrode film 142 and the electrode film 132 are partially in contact with each other, in fact, the electrode film 142 and the electrode film 132 are insulated from each other by the same material as the planarization insulating film 170 or the like, and the electrode film 142 is electrically connected only to the electrode film 162. Furthermore, while FIG. 7, shows as if the electrode film 135 and the electrode film 132 are partially in contact with each other, in fact, the electrode film 135 and the electrode film 132 are insulated from each other by the same material as the planarization insulating film 170 or the like, and the electrode film 132 is electrically connected only to the cathode 122.

The method of manufacturing the organic EL device 100 of the present example embodiment is described below with reference to examples. This manufacturing method, however, is merely an example, and the organic EL device 100 of the present example embodiment may be manufactured by any method.

First, the anode 121, the organic EL layer 123, and the cathode 122 are sequentially formed on one surface of the substrate 110 in the same manner as in the first example embodiment.

Next, the organic film 163 is formed on the cathode 122 in the same manner as the formation of the organic EL layer 123 described above.

Next, the electrode film 162 is formed on the organic film 163 in the same manner as the formation of the cathode 122 described above.

Next, the planarization insulating film 170 is formed on the electrode film 162. The planarization insulating film 170 can be formed with, for example, the material for forming the planarization insulating film 170 by a sputtering method or the like.

Next, the electrode film 161 is formed on the planarization insulating film 170 in the same manner as the formation of the cathode 122 described above.

Next, the current adjustment part 150 is formed on the electrode film 161. The current adjustment part 150 can be formed with, for example, the material for forming the current adjustment part 150 by a sputtering method, a vacuum deposition method, or the like.

Next, the electrode film 142 is formed on the current adjustment part 150 in the same manner as the formation of the cathode 122 described above.

Next, the organic film 143 is formed on the electrode film 142 in the same manner as the formation of the organic EL layer 123 described above.

Next, the electrode film 135 is formed on the organic film 143 in the same manner as the formation of the cathode 122 described above.

Next, the dielectric 133 is formed on the electrode film 135 with the material for forming the dielectric 133 in the same manner as the formation of the planarization insulating film 170 described above.

Next, the electrode film 132 is formed on the dielectric 133 in the same manner as the formation of the cathode 122 described above.

Figure 8:
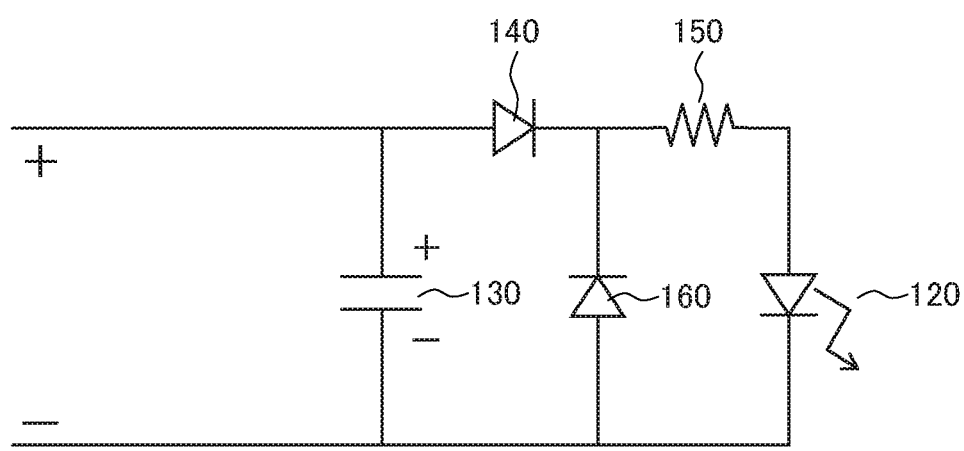
FIG. 8 is an equivalent circuit diagram of an example of the organic EL device according to the fifth example embodiment.

FIG. 8 is an equivalent circuit diagram of the organic EL device 100 of the present example embodiment. In FIG. 8, the "+" at the upper left and the "−" at the lower left indicate the types of electric power supplied from an external power source. The "+" indicates that the electrode film 135 in FIG. 7 is electrically connected thereto. The "−" indicates that the electrode film 132 in FIG. 7 is electrically connected thereto.

The unipolar element 160 is disposed in parallel in the direction opposite to the direction of the forward bias of the organic EL element part 120, and is disposed in series in the same direction as the direction of the forward bias of the organic EL element part 120.

In addition to the effects obtained in the fourth example embodiment, by providing the unipolar element 160, the organic EL device 100 of the present example embodiment achieves the following effects. That is, by setting the reverse voltage of the unipolar element 160 to be equal to or higher than the forward voltage of the organic EL element part 120, a current does not normally flow to the unipolar element 160, and therefore, the illumination of the organic EL element part 120 is not affected. On the other hand, when a large reverse bias is applied to the organic EL element part 120, a current flows to the unipolar element 160, so that the organic EL element part 120 can be prevented from being damaged. Furthermore, by disposing the unipolar element 160 whose on-voltage is adjusted in combination with the current adjustment part 150, even if a forward bias current equal to or larger than a certain value is applied to the organic EL element part 120, the current can flow to the unipolar element 160, and the organic EL element part 120 can be prevented from being damaged.

While FIG. 7 shows the organic EL device 100 in which the unipolar element 160 is disposed between the organic EL element part 120 and the current adjustment part 150, the unipolar element 160 may be disposed at any position on one surface of the substrate 110 in the organic EL device 100 of the present example embodiment. Furthermore, while the present example embodiment shows an example in which the bottom emission type organic EL device of the first example embodiment further includes a unipolar element, the top emission type organic EL devices of the second and third example embodiments can also bring about the same effect as in the present example embodiment by including the unipolar element at any position on one surface of the substrate 110.

While the present invention has been described above with reference to illustrative example embodiments, the present invention is by no means limited thereto. Various changes and variations that may become apparent to those skilled in the art may be made in the configuration and specifics of the present invention without departing from the scope of the present invention.

A part of or the whole of the above-described embodiments can be described as the following supplementary notes. However, the present invention is by no means limited thereto.

(Supplementary Note 1)

An organic EL device including:

a substrate;

an organic EL element part; and a charge storage part, wherein the organic EL element part is disposed on one surface of the substrate, the charge storage part is disposed on the organic EL element part, the organic EL element part includes a pair of electrodes and an organic EL layer, and the organic EL layer is sealed inside so as to be shielded from the outside air by any of the substrate, the pair of electrodes of the organic EL element part, and the charge storage part.

(Supplementary Note 2)

The organic EL device according to supplementary note 1, wherein the charge storage part includes a pair of electrodes and a dielectric, and the charge storage part is a laminate in which one of the pair of electrodes, the dielectric, and the other of the pair of electrodes are stacked in this order.

(Supplementary Note 3)

The organic EL device according to supplementary note 1 or 2, further including:

a rectification part, wherein the rectification part is disposed on the charge storage part.

(Supplementary Note 4)

The organic EL device according to supplementary note 1 or 2, further including:

a rectification part, wherein the rectification part is disposed between the organic EL element part and the charge storage part.

(Supplementary Note 5)

The organic EL device according to supplementary note 3 or 4, wherein the rectification part includes a pair of electrodes and an organic film, and the rectification part is a laminate in which one of the pair of electrodes, the organic film, and the other of the pair of electrodes are stacked in this order.

(Supplementary Note 6)

The organic EL device according to any one of supplementary notes 1 to 5, wherein the organic EL element part is a laminate in which one of the pair of electrodes, the organic EL layer, and the other of the pair of electrodes are stacked in this order, and the electrode on a substrate side is a transparent electrode.

(Supplementary Note 7)

An organic EL device including:

a substrate;

an organic EL element part;

a charge storage part; and a sealing film, wherein the charge storage part is disposed on one surface of the substrate, the organic EL element part is disposed on the charge storage part, the sealing film is disposed on the organic EL element part, the organic EL element part includes a pair of electrodes and an organic EL layer, and the organic EL layer is sealed inside so as to be shielded from the outside air by the pair of electrodes of the organic EL element part and the sealing film.

(Supplementary Note 8)

The organic EL device according to supplementary note 7, further including:

a rectification part, wherein the rectification part is disposed between the substrate and the charge storage part.

(Supplementary Note 9)

The organic EL device according to supplementary note 8, wherein the rectification part includes a pair of electrodes and an organic film, and the rectification part is a laminate in which one of the pair of electrodes, the organic film, and the other of the pair of electrodes are stacked in this order.

(Supplementary Note 10)

The organic EL device according to any one of supplementary notes 7 to 9, wherein the organic EL element part is a laminate in which one of the pair of electrodes, the organic EL layer, and the other of the pair of electrodes are stacked in this order, and the electrode on an opposite side of the substrate is a transparent electrode.

(Supplementary Note 11)

The organic EL device according to any one of supplementary notes 1 to 10, further including:

a current adjustment part that adjusts a current supplied from the charge storage part to the organic EL element part on any position on one surface of the substrate.

(Supplementary Note 12)

The organic EL device according to any one of supplementary notes 1 to 11, further including:

a single-carrier unipolar element on any position on one surface of the substrate, wherein the unipolar element is disposed in parallel in a direction opposite to a direction of a forward bias of the organic EL element part, and is disposed in series in the same direction as the direction of the forward bias of the organic EL element part.

INDUSTRIAL APPLICABILITY

The present invention can provide an organic EL device that can ensure safety by automatic light emission of afterglow illumination even when the power is shut off due to a power failure, turning-off, or the like. The organic EL device of the present invention can be, for example, used in a wide range of applications such as illumination devices, light sources, display devices, and the like.

REFERENCE SIGNS LIST 100 organic EL device
110 substrate
120 organic EL element part
121 anode
122 cathode
123 organic EL layer
130 charge storage part
132, 135, 142, 161, 162 electrode film
133 dielectric
140 rectification part
143, 163 organic film 150 current adjustment part
160 unipolar element
170 planarization insulating film

The invention claimed is:

1. An organic EL device comprising:
a substrate;
an organic EL element part;
a rectification part; and
a charge storage part, wherein
the organic EL element part is disposed on one surface of the substrate,
the charge storage part is disposed on the organic EL element part,
the charge storage part comprises a first pair of electrodes and a dielectric,
the charge storage part is a laminate in which one of the first pair of electrodes, the dielectric, and the other of the pair of electrodes are stacked in this order,
the organic EL element part comprises a second pair of electrodes and an organic EL layer,
the organic EL layer is sealed inside so as to be shielded from the outside air by any of the substrate, the second pair of electrodes of the organic EL element part, and the charge storage part, and
the rectification part is disposed on the charge storage part.

2. The organic EL device according to claim 1, wherein the rectification part is disposed between the organic EL element part and the charge storage part.

3. The organic EL device according to claim 1, wherein the rectification part comprises a third pair of electrodes and an organic film, and the rectification part is a laminate in which one of the third pair of electrodes, the organic film, and the other of the third pair of electrodes are stacked in this order.

4. An organic EL device comprising:
a substrate;
an organic EL element part;
a charge storage part;
a rectification part; and
a sealing film, wherein
the charge storage part is disposed on one surface of the substrate,
the organic EL element part is disposed on the charge storage part,
the sealing film is disposed on the organic EL element part,
the organic EL element part comprises a first pair of electrodes and an organic EL layer, and
the organic EL layer is sealed inside so as to be shielded from the outside air by the first pair of electrodes of the organic EL element part and the sealing film, and
the rectification part is disposed between the substrate and the charge storage part.

5. The organic EL device according to claim 4, wherein the rectification part comprises a second pair of electrodes and an organic film, and
the rectification part is a laminate in which one of the second pair of electrodes, the organic film, and the other of the second pair of electrodes are stacked in this order.

* * * * *